United States Patent
Chen et al.

(10) Patent No.: US 11,073,407 B2
(45) Date of Patent: Jul. 27, 2021

(54) ELECTRONIC DEVICE AND POSE-CALIBRATION METHOD THEREOF

(71) Applicant: HTC Corporation, Taoyuan (TW)

(72) Inventors: Yan-Chen Chen, Taoyuan (TW); Cheng-Han Hsieh, Taoyuan (TW); Shin-Hao Dai, Taoyuan (TW); Huan-Hsin Li, Taoyuan (TW)

(73) Assignee: HTC CORPORATION, Taoyuan (TW)

( * ) Notice: Subject to any disclaimer, the term of this patent is extended or adjusted under 35 U.S.C. 154(b) by 377 days.

(21) Appl. No.: 16/165,374

(22) Filed: Oct. 19, 2018

(65) Prior Publication Data
US 2020/0124443 A1    Apr. 23, 2020

(51) Int. Cl.
| | |
|---|---|
| G01C 25/00 | (2006.01) |
| G01C 1/00 | (2006.01) |
| G01R 33/02 | (2006.01) |
| G01P 15/08 | (2006.01) |
| G01C 19/5776 | (2012.01) |
| G01P 21/00 | (2006.01) |

(52) U.S. Cl.
CPC ............... G01C 25/00 (2013.01); G01C 1/00 (2013.01); G01C 19/5776 (2013.01); G01P 15/0802 (2013.01); G01P 21/00 (2013.01); G01R 33/02 (2013.01)

(58) Field of Classification Search
CPC ...... G01C 25/00; G01C 1/00; G01C 19/5776; G01P 21/00; G01P 15/0802; G01R 33/02
See application file for complete search history.

(56) References Cited

U.S. PATENT DOCUMENTS

| | | | | |
|---|---|---|---|---|
| 10,802,147 | B2* | 10/2020 | Nerurkar | ................... G06T 7/73 |
| 2009/0076765 | A1 | 3/2009 | Kulach et al. | |
| 2014/0297217 | A1 | 10/2014 | Yuen | |
| 2016/0055671 | A1* | 2/2016 | Menozzi | ............... G01C 21/165 |
| | | | | 701/300 |
| 2019/0389600 | A1* | 12/2019 | Troy | ....................... G01N 29/26 |

FOREIGN PATENT DOCUMENTS

| | | |
|---|---|---|
| CN | 102323854 A | 1/2012 |
| CN | 106500695 A | 3/2017 |
| TW | 201814447 A | 4/2016 |
| TW | 201820080 A | 6/2018 |

* cited by examiner

*Primary Examiner* — Bryan Bui
(74) *Attorney, Agent, or Firm* — Birch, Stewart, Kolasch & Birch, LLP

(57) ABSTRACT

An electronic device is provided. The electronic device includes an inertial-measurement unit, an environmental-parameter database, and a computation unit. The inertial-measurement unit is configured to detect inertial information of the electronic device to generate sensor data. The computation unit is configured to perform pose estimation according to the sensor data to obtain a first pose. In response to the electronic device being in a non-moving state, the computation unit performs pose calibration on the first pose according to an environmental parameter in the environmental-parameter database corresponding to a current location at which the electronic device is located.

8 Claims, 7 Drawing Sheets

ELECTRONIC DEVICE AND POSE-CALIBRATION METHOD THEREOF

BACKGROUND OF THE INVENTION

Field of the Invention

The invention relates to electronic devices, and, in particular, to an electronic device and a pose-calibration method thereof.

Description of the Related Art

Currently, most electronic devices equipped with a human-motion-capture function have to operate in a good environment with low magnetic interference to maintain accurate pose/attitude estimation results.

However, in actual use, the environments in which an electronic device may be operated may contain electrical appliances such as televisions, monitors, game consoles, and other household appliances. These electrical appliances can generate magnetic fields that may affect the operation of the electronic device. This situation also leads to inaccurate results of pose/attitude estimation.

BRIEF SUMMARY OF THE INVENTION

An electronic device and a pose-calibration method thereof are provided to reduce the impact of various environmental magnetic fields on pose estimation and to improve the accuracy of pose-estimation results.

In an exemplary embodiment, a pose-calibration method for use in an electronic device is provided. The electronic device comprises an inertial-measurement unit and an environmental-parameter database. The method includes the steps of: detecting inertial information about the electronic device by the inertial-measurement unit to generate sensor data; performing pose estimation according to the sensor data to obtain a first pose; and in response to the electronic device being in a non-moving state, performing pose calibration on the first pose according to an environmental parameter in the environmental-parameter database that corresponds to a current location at which the electronic device is located.

In another exemplary embodiment, an electronic device is provided. The electronic device includes an inertial-measurement unit, an environmental-parameter database, and a computation unit. The inertial-measurement unit is configured to detect inertial information of the electronic device to generate sensor data. The computation unit is configured to perform pose estimation according to the sensor data to obtain a first pose. In response to the electronic device being in a non-moving state, the computation unit performs pose calibration on the first pose according to an environmental parameter in the environmental-parameter database corresponding to a current location at which the electronic device is located.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Figure 1:
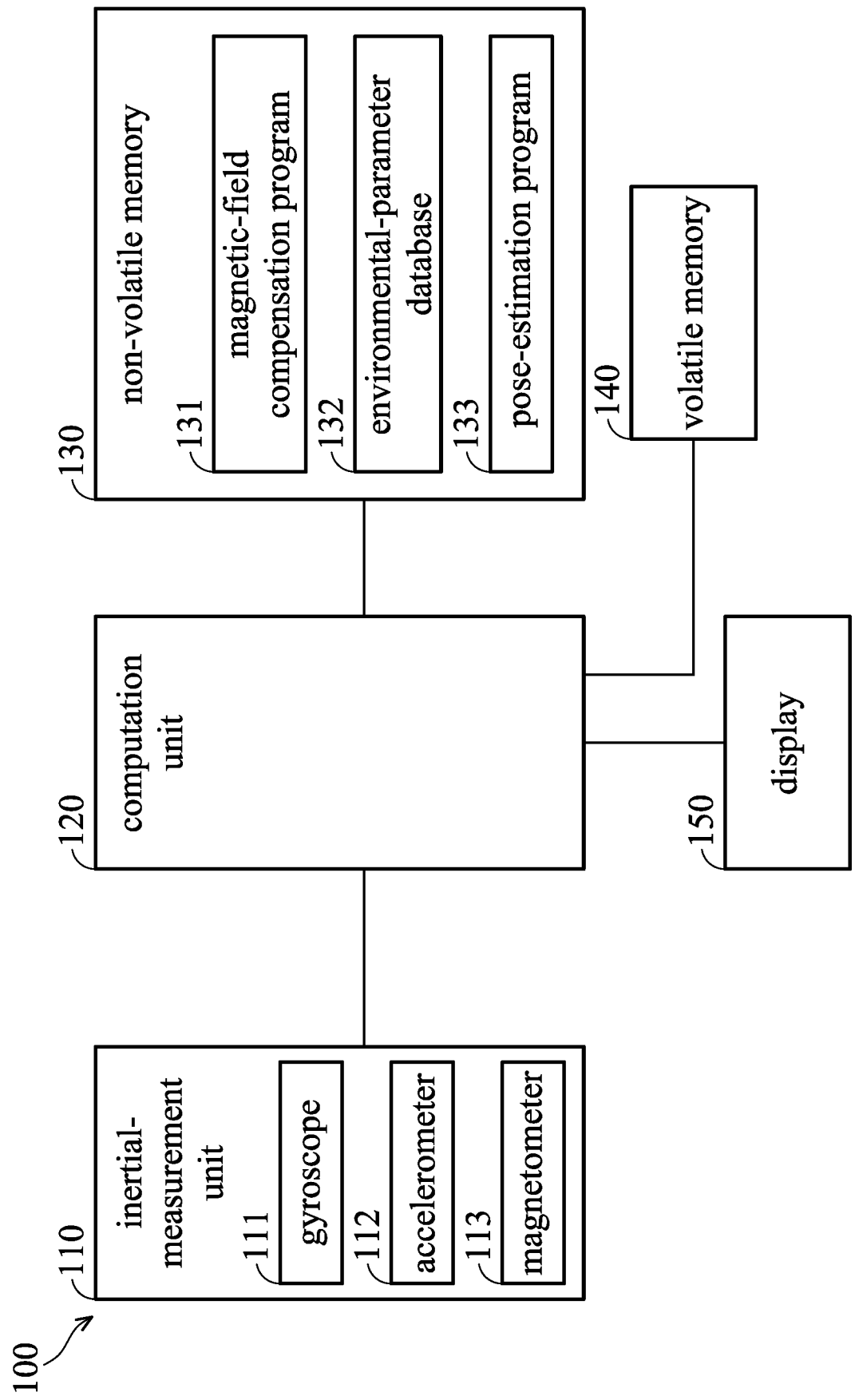
FIG. 1 is a schematic block diagram of an electronic device in accordance with an embodiment of the invention.

FIG. 1 is a schematic block diagram of an electronic device in accordance with an embodiment of the invention. The electronic device 100 may be a human-motion-capture device. As depicted in FIG. 1, the electronic device 100 may include one or more inertial-measurement units (IMUs) 110, a computation unit 120, a non-volatile memory 130, a volatile memory 140, and a display 150.

The inertial-measurement unit 110 is configured to measure inertial information of the electronic device 100 to generate sensor data. In an embodiment, the inertial-measurement unit 110 includes a gyroscope 111, an accelerometer 112, and a magnetometer 113. The gyroscope 111 is configured to estimate the orientation and angular speed of the electronic device 100. The accelerometer 112 is configured to estimate the acceleration of the electronic device 100. The magnetometer 113 is configured to estimate the magnetic-field strength and the magnetic-field direction of the electronic device 100. For example, the sensor data measured by the gyroscope 111, accelerometer 112, and magnetometer 113 belongs to the inertial information. The computation unit 120 may be a general-purpose processor, a digital signal processor (DSP), a microprocessor, or a microcontroller, but the invention is not limited thereto.

The non-volatile memory 130 may be a memory device such as a hard disk drive (HDD), a solid-state disk (SSD), or a read-only memory, but the invention is not limited thereto. The non-volatile memory 130 may store a magnetic-field compensation program 131, an environmental-parameter database 132, and a pose-estimation program 133.

The volatile memory 140 may be a random access memory such as a static random access memory (SRAM) or a dynamic random access memory, but the invention is not limited thereto.

The display 150 may be a head-mounted display (HMD), a liquid-crystal display (LCD), a light-emitting diode (LED) display, or an organic light-emitting diode (OLED) display, but the invention is not limited thereto.

In an embodiment, the inertial-measurement units 110 may be installed or attached on the head, limbs, or body of the user operating the electronic device 100, and can separately detect inertial information in different parts.

The computation unit 120 may load the magnetic-influence compensation program 131 and the pose-estimation program 133 to the volatile memory 140 from the non-volatile memory 130 for execution. For example, the magnetic-influence compensation program 131 may receive the sensor data from each inertial-measurement unit 110. Thus, the computation unit 120 may calculate the inertial information of the electronic device 100 to determine the level of magnetic influence in the environment where the electronic device 100 is currently located, and calibrate the calculated inertial information of the electronic device 100 according to the determined level of magnetic influence. The pose-estimation program 133 may estimate the pose of the user according to the calculated inertial information, thereby constructing a human motion behavior.

When the user wears the electronic device 100 and moves, the computation unit 120 may build or update the magnetic-field strength and magnetic-field direction at different locations that are recorded in the environmental-parameter database 132. For example, in a typical home, there may be many electrical appliances around, such as a television, a computer monitor, a game console, and other household appliances, and each of these appliances may generate a magnetic field, thereby affecting the electronic device 100. When the user is wearing the electronic device 100 and moving, the magnetic-field strength and magnetic-field direction detected by the magnetometer 113 at different locations may differ from each other. In addition, when the user is moving all the time, the error level of the sensor data detected by the inertial-measurement unit 110 also increases with time. Thus, an environmental-parameter database 132 recording magnetic-field information around the electronic device 100 is built in the present invention, and thus the inertial information of the electronic device 100 can be calculated according to the magnetic-field information at different locations, thereby facilitating subsequent determinations of pose estimation.

Figure 2:
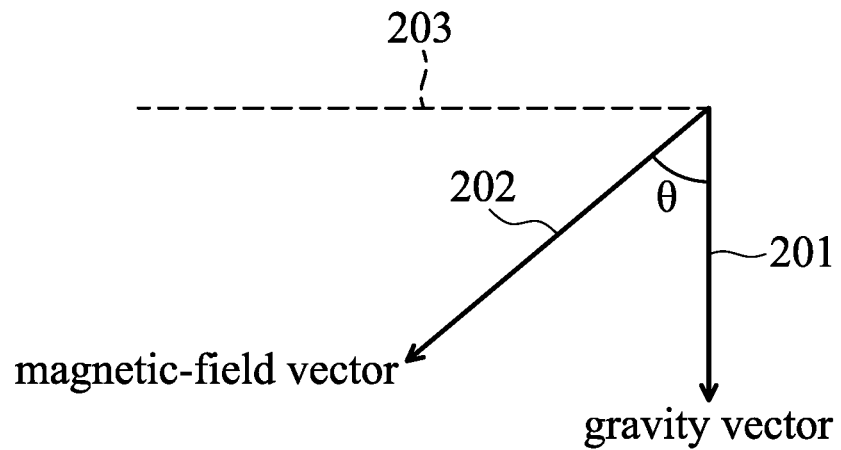
FIG. 2 is a diagram of measuring magnetic-field parameters in accordance with an embodiment of the invention.

FIG. 2 is a diagram of measuring magnetic-field parameters in accordance with an embodiment of the invention. As depicted in FIG. 2, the gyroscope 111, magnetometer 113, and accelerometer 112 of the inertial-measurement unit 110 may respectively detect the horizontal line 203, magnetic-field vector 202, and the gravity vector 201 at the location in which the electronic device is located. The length of the magnetic-field vector 202 indicates the magnetic-field strength. The computation unit 120 may calculate the magnitude of the magnetic field and the dip angle (i.e., inner angle) between the magnetic-field vector 202 and the gravity vector 201 according to the sensor data detected by the inertial-measurement unit 110. The dip angle between the magnetic-field vector 202 and the gravity vector 201 can also be regarded as a horizontal pose angle θ.

Figure 3A:
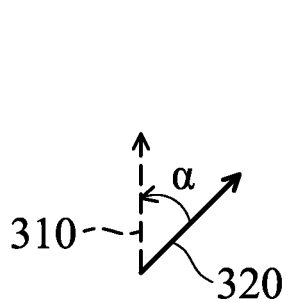
FIG. 3A is a top view of measuring magnetic-field parameters in accordance with an embodiment of the invention.

FIG. 3A is a top view of measuring magnetic-field parameters in accordance with an embodiment of the invention. In an embodiment, the computation unit 120 may estimate the horizontal magnetic heading 320 according to the currently-estimated pose and the numeric value detected by the magnetometer 113, wherein direction 310, for example, may be a reference direction or an initial direction set by the computation unit 120, and the computation 120 may calculate an inner angle between direction 310 and the horizontal magnetic heading 320.

Figure 3B:
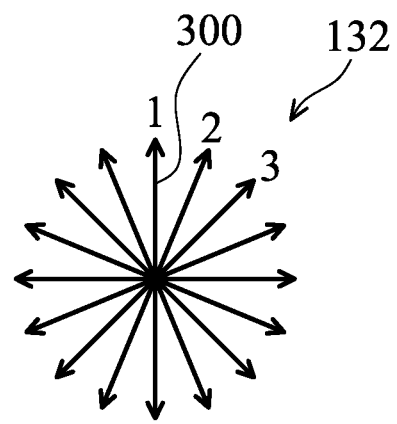
FIG. 3B is a diagram of groups within the environmental-parameter database in accordance with an embodiment of the invention.

FIG. 3B is a diagram of groups within the environmental-parameter database in accordance with an embodiment of the invention. In addition, in an embodiment, there are 360 degrees of a circle on a plane. Given that the initial location of the electronic device 100 is set to 0 degrees such as direction 300, the computation unit 120 may divide the range of 360 degrees (e.g., the range between +180 degrees and −180 degrees) into multiple data sets, and record the corresponding horizontal magnetic heading, magnetic-field strength, and inner angle into the environmental-parameter database 132. For example, each data set in the environmental-parameter database 132 may indicate a range for angle α such as the range between −1 degree and +1 degree. For example, the range of angle α of the first data set is between −1 degree and +1 degree, and the range of angle α of the second data set is between +1 degree and +3 degrees, and so forth. In addition, the number of data sets in the environmental-parameter database 132 can be determined according to practical conditions. If the range of angle α is narrower, the number of data sets is greater, and the resolution of the magnetic-field information is also higher. In FIG. 3B, the computation unit 120 may set the number of data sets in the environmental-parameter database 132 to 16.

Figure 4A:
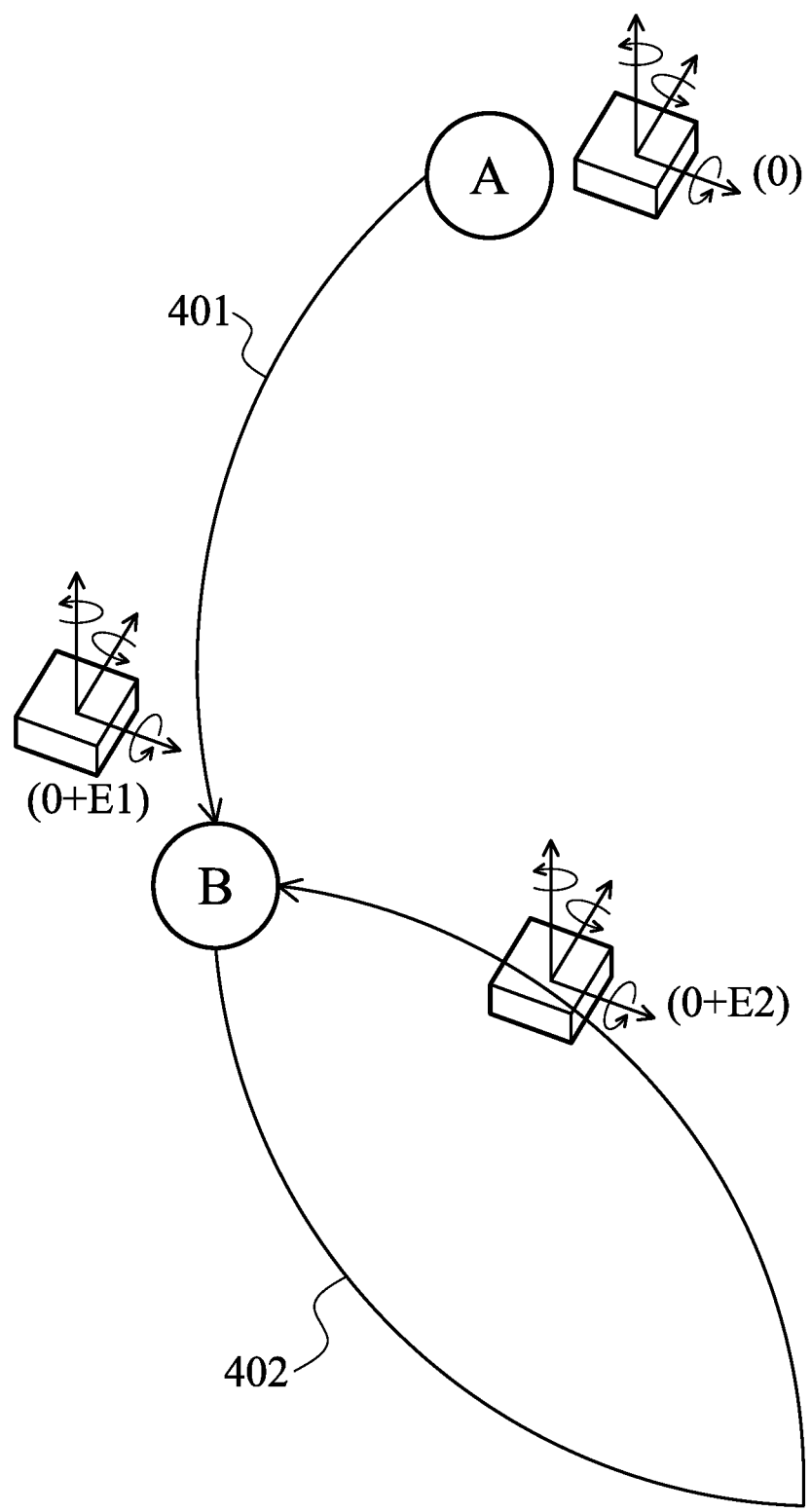
FIG. 4A is a diagram of moving paths of the electronic device in accordance with an embodiment of the invention.

FIG. 4A is a diagram of the moving paths of the electronic device in accordance with an embodiment of the invention.

As depicted in FIG. 4A, when the user wearing the electronic device 100 activates the electronic device 100 in location A, the computation unit 120 may set location A as the initial location (i.e., a reference location), and detect an environmental parameter of the electronic device 100 at location A using the inertial-measurement unit 110. Meanwhile, the computation unit 120 may set the error level at location A to 0.

When the user continues to move along path 402 for 5 seconds and then reaches location B and stops moving, the inertial information calculated by the computation unit 120 at location B is accumulated to the error level E1. Since the electronic device 100 reaches location B for the first time after being activated, the environmental-parameter database 132 does not record relevant information about location B, and thus the computation unit 120 records the environmental parameter of location B in the environmental-parameter database 132.

Then, the user starts from location B and continues to move along path 402 for 50 seconds to reach location B again and stops moving. Assuming that the error level accumulated by the electronic device 100 only through path 402 is E2, the inertial information calculated by the electronic device 100 at the second time to location B is accumulated to the error level (E1+E2).

Then, the computation unit 120 may determine that the error level (E1+E2) is higher than the error level E1. Meanwhile, the computation unit 120 does not update the environmental-parameter database 132, and calibrates the status of the inertial-measurement unit 110 to the error level E1 about location B previously recorded in the environmental-parameter database 132. That is, if the electronic device 100 does not return to location A and regards location B as the subsequent reference location, the computation unit 120 may perform the calibration according to the error level E1 at location B.

Figure 4B:
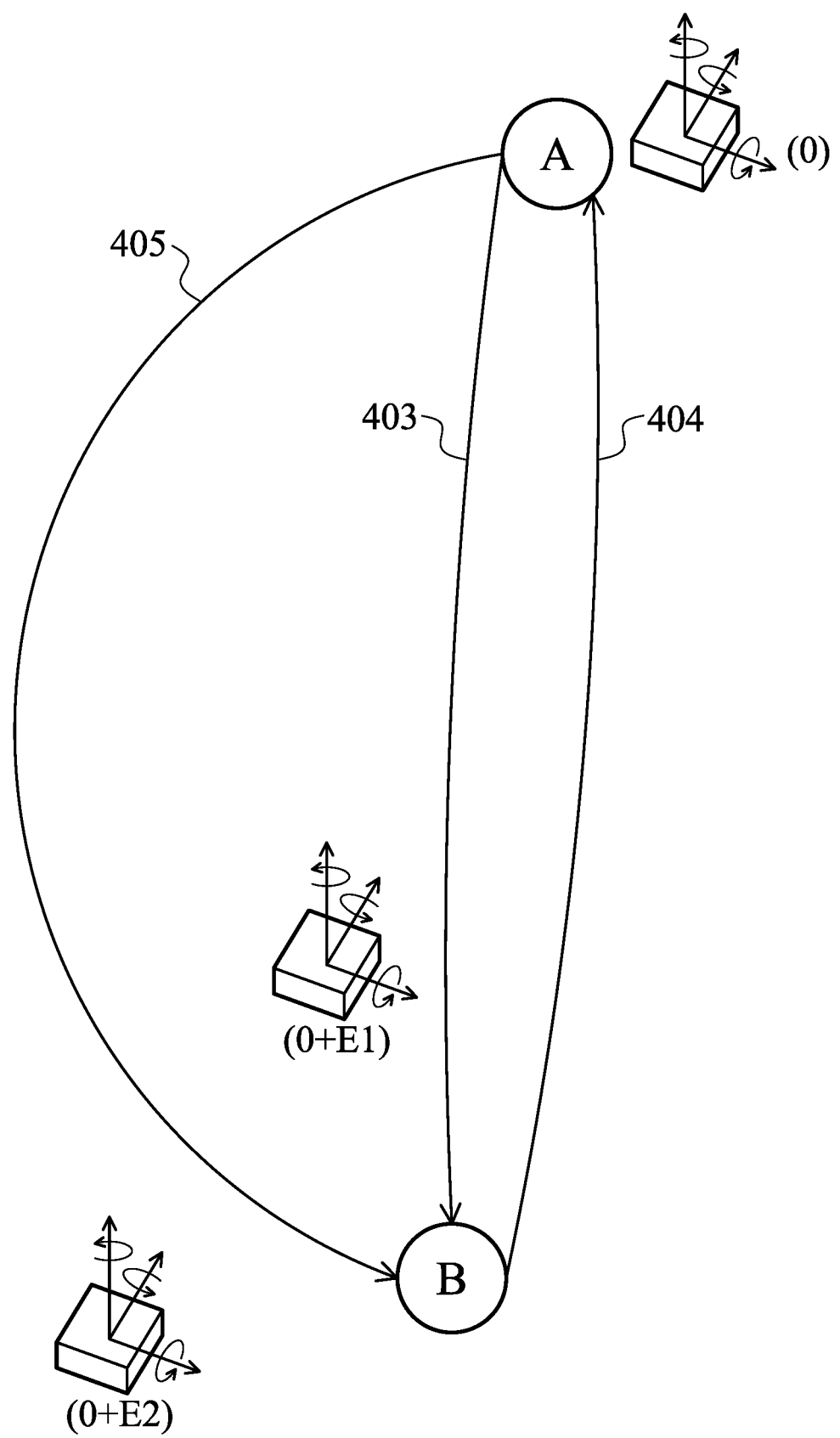
FIG. 4B is a diagram of moving paths of the electronic device in accordance with an embodiment of the invention.

FIG. 4B is a diagram of moving paths of the electronic device in accordance with an embodiment of the invention.

As depicted in FIG. 4B, when the user wearing the electronic device 100 activates the electronic device 100 at location A, the computation unit 120 may set location A as the initial location (i.e., a reference location), and detect the environmental parameter of location A using the inertial-measurement unit 110. Meanwhile, the computation unit 120 may set the error level at location A to 0.

When the user continues to move along path 403 for 50 seconds and reaches location B and stops moving, the inertial information calculated by the computation unit 120 at location B is accumulated to the error level E1. Since the electronic device 100 reaches location B for the first time after being activated, the environmental-parameter database 132 does not record relevant information about location B, and thus the computation unit 120 records the environmental parameter of location B in the environmental-parameter database 132.

Then, the user starts from location B and continues to move along path 404 for 30 seconds to return to location A and temporarily stays there. The computation unit 120 may determine that the electronic device 100 has returned to location A according to the environmental parameter of location A recorded in the environmental-parameter database 132, and may gradually calibrate the error level of the sensor data detected by the inertial-measurement unit 110 to 0.

Then, the user starts again from location A and continues to move along path 405 for 5 seconds to return to location B and stays there. Assuming that the error level accumulated by the electronic device 100 only through path 404 is E2, since the electronic device 100 has returned to location A and temporarily stays on the way, the computation unit 120 may calibrate the error level such as calibrating the error level to 0 at location A. Accordingly, the error level of the inertial information calculated by the computation unit 120 at the second time reaching location B is accumulated to the error level E2. When the error level E2 is lower than the error level E1 previously recorded at location B, the computation unit 120 updates the environmental parameter of location B in the environmental-parameter database 120.

In an embodiment, when the electronic device 100 is continuously moving, the error level of the sensor data detected by the inertial-measurement unit 110 will also be continuously accumulated, such as an increasing error level of the rotation-angle data detected by the gyroscope 111. Referring to FIG. 4B, the user returns to location A from location B along path 404, the computation unit 120 may calibrate the rotation-angle data detected by the gyroscope 111 according to the environmental parameter of location A recorded in the environmental-parameter database 132, such as calibrating the rotation-angle data detected by the gyroscope 111 to the rotation-angle data at location A. In the example, the sensor data (e.g., rotation-angle data) detected by the gyroscope 111 is described, and the sensor data detected by the accelerometer 112 and magnetometer 113 can be calibrated in a similar manner.

Specifically, assuming that location A is the initial location, if the electronic device 100 leaves from location A, after a relatively long period of time, as long as the electronic device 100 returns to location A, the computation unit 120 may calibrate the sensor data detected by the inertial-measurement unit 110 according to the environmental parameter of location A recorded in the environmental-parameter database 132.

Figure 5:
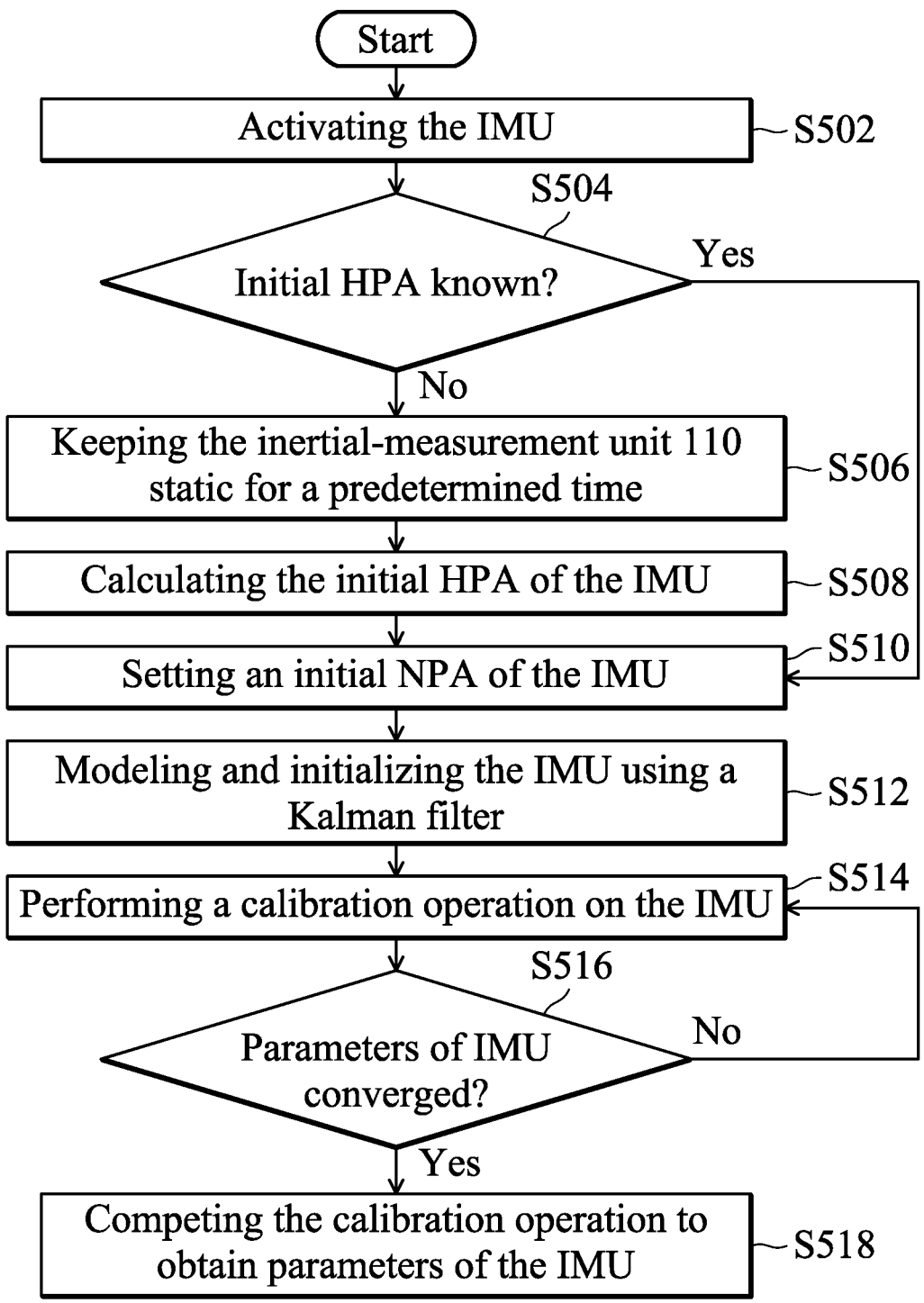
FIG. 5 is a flow chart of calibration on the inertial-measurement unit in the initial state in accordance with an embodiment of the invention.

FIG. 5 is a flow chart of calibration on the inertial-measurement unit in the initial state in accordance with an embodiment of the invention.

In step S502, the inertial-measurement unit 110 is activated.

In step S504, it is determined whether an initial horizontal pose angle (HPA) of the inertial-measurement unit 110 is known. If the initial horizontal pose angle is known, step S510 is performed. If the initial horizontal pose angle is not known, step S506 is performed.

In step S506, the inertial-measurement unit 110 is kept static for a predetermined time such as several seconds. Meanwhile, the inertial-measurement unit 110 may detect various inertial information in the current environment.

In step S508, the initial horizontal pose angle of the inertial-measurement unit 110 is calculated. For example, the initial horizontal pose angle can be calculated using the inertial information of the inertial-measurement unit 110 being static in step S506.

In step S510, an initial navigation pose angle (NPA) of the inertial-measurement unit 110 is set.

In step S512, the inertial-measurement unit 110 is modelized and initialized using a Kalman filter. One having ordinary skill in the art will appreciate the technique for modeling the inertial-measurement unit using the Kalman filter, the horizontal pose angle, and the navigation pose angle, and thus the details are omitted here.

In step S514, a calibration operation is performed on the inertial-measurement unit 110. For example, the calibration operation may control the inertial-measurement unit 110 to rotate around its measurement center (or approximately its measurement center) in a space, and simultaneously perform data processing.

In step S516, it is determined whether parameters of the inertial-measurement unit 110 to be estimated have converged to a corresponding extent. If so, step S518 is performed. If not, step S514 is performed to continue the calibration operation.

In step S518, the calibration operation is completed to obtain parameters of the inertial-measurement unit 110. For example, in response to the completion of step S518, the calibration operation of the inertial-measurement unit 110 is completed, and the sensor data detected by the inertial-measurement unit 110 can be used for subsequent calculations.

Figure 6:
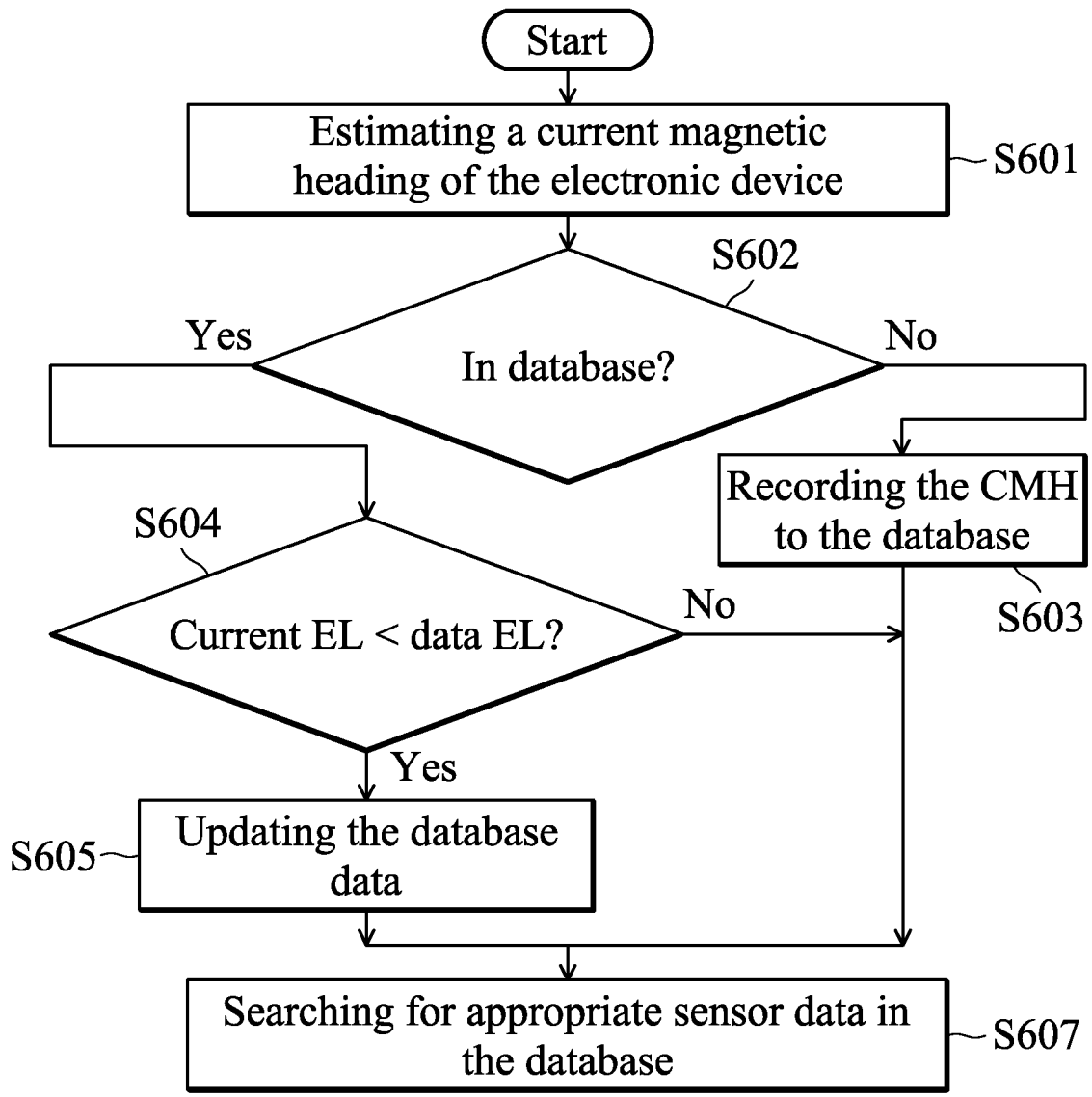
FIG. 6 is a flow chart of a procedure of building the environmental-parameter database in accordance with an embodiment of the invention.

FIG. 6 is a flow chart of a procedure of building the environmental-parameter database in accordance with an embodiment of the invention. In step S601, a current magnetic heading of the electronic device 100 is estimated, wherein the current magnetic heading is a horizontal magnetic heading, as described in the embodiment of FIG. 3A.

In step S602, it is determined whether the current magnetic heading is stored in the environmental-parameter database 132. If the current magnetic heading is recorded in the environmental-parameter database 132, step S604 is performed. If the current magnetic heading is not recorded in the environmental-parameter database 132, step S603 is performed.

In step S603, the current magnetic heading is stored into the environmental-parameter database 132. That is, in response to the determination of step S602 is "No", it indicates that the current magnetic heading is not stored in the environmental-parameter database 132, and thus the current magnetic heading can be stored into the environmental-parameter database 132.

In step S604, it is determined whether the current error level (EL) of the inertial-measurement unit 110 is lower than the error level of corresponding data in the environmental-parameter database 132. If so, step S605 is performed. If not, step S607 is performed.

In step S605, the database data is updated. Because the current error level of the inertial-measurement unit 110 is lower than the database data in the environmental-parameter database 132 (i.e., the same or similar environmental parameter), the computation unit 120 may update the current error level of the inertial-measurement unit 110 to the environmental-parameter database 132 to replace the previously recorded environmental parameter and its error level. If the current error level of the inertial-measurement unit 110 is higher than that of the database data in the environmental-parameter database 132, the computation unit 120 does not update the database data in the environmental-parameter database 132.

In step S607, appropriate sensor data is searched for in the environmental-parameter database 132. Since the environmental parameters stored in the environmental-parameter database 132 are classified into multiple groups (e.g., the inner angle α between direction 310 and the horizontal magnetic heading 320 shown in FIG. 3), it is not necessary for the environment parameter at the current location to be identical to that in a corresponding group in the environmental-parameter database 132. Accordingly, the computation unit 120 has to search for whether there is appropriate sensor data in the environmental-parameter database 132 to perform pose calibration.

Figure 7:
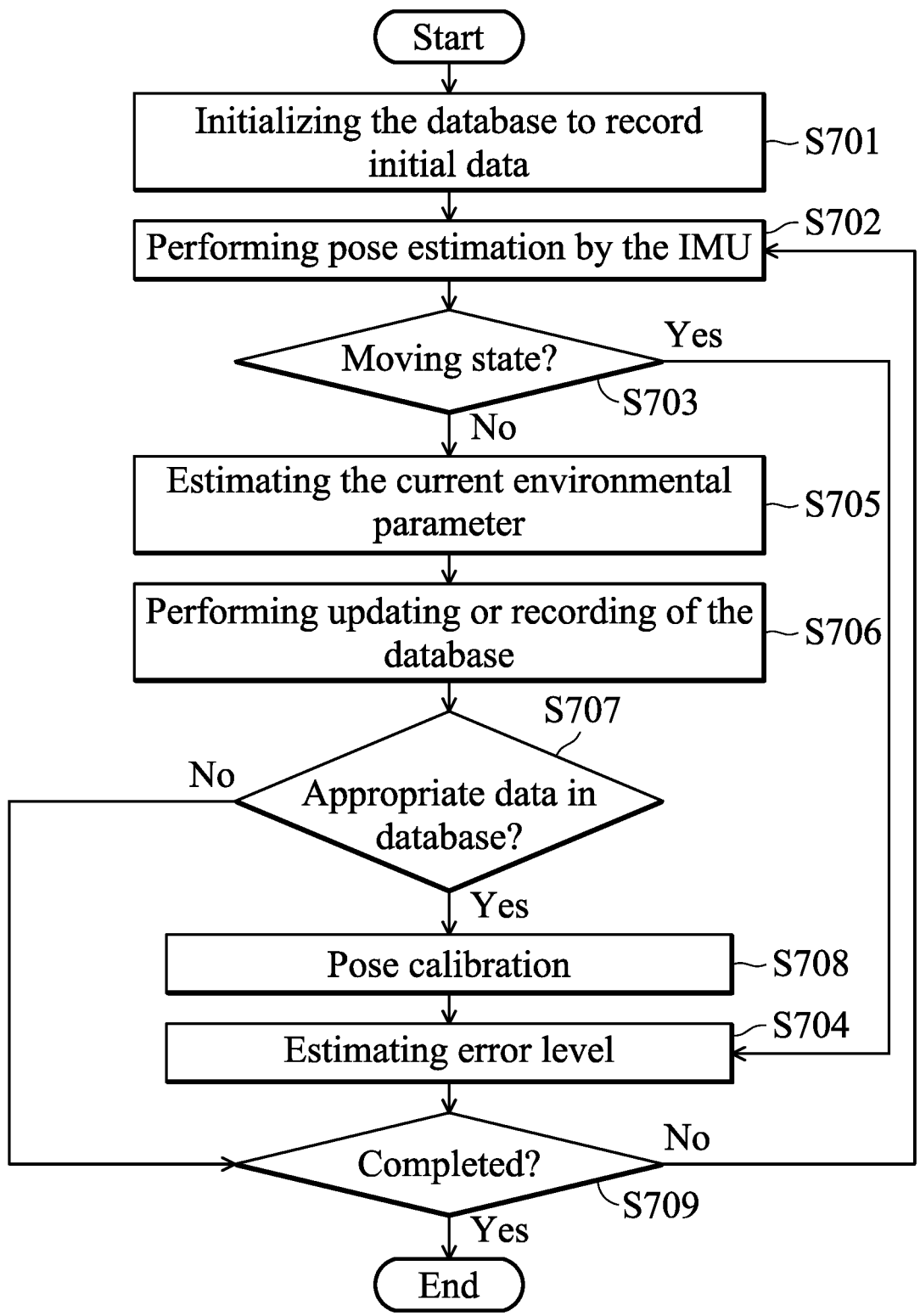
FIG. 7 is a flow chart of a pose-calibration method in accordance with an embodiment of the invention.

FIG. 7 is a flow chart of a pose-calibration method in accordance with an embodiment of the invention.

In step S701, the environmental-parameter database is initialized to record initial data. For example, upon the electronic device 100 being activated or reset, the computation unit 120 has to initialize the environmental-parameter database 132 because the initialized environmental-parameter database 132 does not record any environmental parameter in the initial state. Then, the computation unit 120 writes the initial data (i.e., environmental parameters) detected by the inertial-measurement unit 110 in the initial state (e.g., at an initial location) into the initialized environmental-parameter database 132.

In step S702, pose estimation is performed by the inertial-measurement unit 110. For example, the computation unit 120 may perform pose estimation according to the sensor data detected by the inertial-measurement unit 110 to obtain a first pose.

In step S703, it is determined whether the electronic device 100 is in a moving state. If the electronic device 100 is in a moving state, step S704 is performed. If the electronic device 100 is not in a moving state, step S705 is performed.

In step S704, an error level is estimated. For example, when the electronic device 100 is continuously in the moving state, the error level of the sensor data detected by the inertial-measurement unit 110 will accumulate over time. The error level increases over time in the moving state, and decreases in response to the occurrence of a pose-calibration event.

In step S705, a current environmental parameter is estimated. For example, since the electronic device 100 is not moving, the current environmental parameter can be estimated using the sensor data detected by the inertial-measurement unit 110 when the electronic device 100 is static, wherein the current environmental parameters include the rotation angle, the horizontal magnetic heading, the inner angle between the magnetic-field vector and the gravity vector, and the magnetic-field strength of the electronic device 100.

In step S706, it is determined whether to perform recording or updating of the environmental-parameter database 132. For example, the flow depicted in FIG. 6 can be referred to for the determination whether to perform recording or updating of the environmental-parameter database 132.

In step S707, appropriate sensor data is searched for in the environmental-parameter database 132. Step S707 is similar to step S607. Since the environmental parameter in the environmental-parameter database 132 are divided into multiple groups (e.g., the inner angle α between direction 310 and the horizontal magnetic heading 320 shown in FIG. 3), the environment parameter at the current location does not need to be identical to that in a corresponding group in the environmental-parameter database 132. Accordingly, the computation unit 120 has to search for whether there is appropriate sensor data in the environmental-parameter database 132 to perform pose calibration. If there is appropriate sensor data, step S708 is performed. If there is no appropriate sensor data, step S709 is performed.

In step S708, pose calibration is performed. For example, the computation unit 120 may perform pose calibration on the estimated first pose in step S702 according to the appropriate sensor data (e.g., may be calibrated or uncalibrated inertial information) obtained from the environmental-parameter database 132.

In step S709, it is determined whether the usage of the electronic device 100 is completed. If so, the flow ends, and the motion detection can be stopped or the electronic device 100 can be turned off. If not, step S702 is performed.

In view of the above, an electronic device and a pose-calibration method thereof are provided in the present invention. The electronic device and the pose-calibration method are capable of building an environmental-parameter database recording the environmental parameter around the electronic device, dynamically using the current environmental parameter having a lower error level to update the environmental parameter stored in the environmental-parameter database, and calibrating the sensor data detected by the inertial-measurement unit using the updated environmental parameter, thereby reducing the impact of environmental magnetic fields on pose estimation, and obtaining more accurate pose-estimation results.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A pose-calibration method, for use in an electronic device, wherein the electronic device comprises an inertial-measurement unit and an environmental-parameter database, the method comprising:
   detecting inertial information about the electronic device by the inertial-measurement unit to generate sensor data;
   performing pose estimation according to the sensor data to obtain a first pose;
   determining whether the electronic device is in a moving state;
   in response to the electronic device being in the moving state, estimating a first error level of the sensor data; and
   in response to the electronic device being in a non-moving state, performing the following steps:
   estimating a current environmental parameter of a location at which the electronic device is located to obtain the first error level of the sensor data;
   obtaining an environmental parameter and its second error level recorded in a corresponding group in the environmental-parameter database according to the current environmental parameter;
   determining whether the first error level is lower than the second error level; and
   in response to the first error level being lower than the second error level, saving the current environmental parameter into the environmental-parameter database to replace the environmental parameter; and
performing pose calibration on the first pose according to the environmental parameter in the environmental-parameter database corresponding to a current location in which the electronic device is located.

2. The pose-calibration method as claimed in claim 1, further comprising:
in response to the current environmental parameter not being stored in a corresponding group in the environmental-parameter database, storing the current environmental parameter into the environmental-parameter database.

3. The pose-calibration method as claimed in claim 1, wherein when the electronic device is in the moving state, the first error level increases with time.

4. The pose-calibration method as claimed in claim 1, wherein the environmental parameter comprises a rotation angle, a horizontal magnetic heading, an inner angle between a magnetic-field vector and a gravity vector, and a magnetic-field strength of the electronic device.

5. An electronic device, comprising:
an inertial-measurement unit, configured to detect inertial information of the electronic device to generate sensor data;
an environmental-parameter database; and
a computation unit, configured to perform pose estimation according to the sensor data to obtain a first pose,
wherein the computation unit further determines whether the electronic device is in a moving state;
wherein in response to the electronic device being in the moving state, the computation unit estimates a first error level of the sensor data; and
wherein in response to the electronic device being in a non-moving state, the computation unit is configured to:
estimate a current environmental parameter of a location at which the electronic device is located to determine the first error level of the sensor data;
obtain an environmental parameter and its second error level recorded in a corresponding group in the environmental-parameter database according to the current environmental parameter;
determine whether the first error level is lower than the second error level; and
in response to the first error level being lower than the second error level, save the current environmental parameter into the environmental-parameter database to replace the environmental parameter; and
perform pose calibration on the first pose according to the environmental parameter in the environmental-parameter database corresponding to a current location at which the electronic device is located.

6. The electronic device as claimed in claim 5, wherein in response to the current environmental parameter not being stored in a corresponding group in the environmental-parameter database, the computation unit stores the current environmental parameter into the environmental-parameter database.

7. The electronic device as claimed in claim 5, wherein when the electronic device is in the moving state, the first error level calculated by the computation unit increases with time.

8. The electronic device as claimed in claim 5, wherein the environmental parameter comprises a rotation angle, a horizontal magnetic heading, an inner angle between a magnetic-field vector and a gravity vector, and a magnetic-field strength of the electronic device.

* * * * *